(12) United States Patent
Hosono et al.

(10) Patent No.: US 7,722,846 B2
(45) Date of Patent: May 25, 2010

(54) METHOD FOR PREPARING ELECTROCONDUCTIVE MAYENITE TYPE COMPOUND

(75) Inventors: Hideo Hosono, Yokohama (JP); Katsuro Hayashi, Yokohama (JP); Sung Wng Kim, Yokohama (JP); Masahiro Hirano, Yokohama (JP); Satoru Narushima, Tokyo (JP); Setsuro Ito, Tokyo (JP)

(73) Assignees: Asahi Glass Company, Limited, Tokyo (JP); Tokyo Institute of Technology, Tokyo (JP)

( * ) Notice: Subject to any disclaimer, the term of this patent is extended or adjusted under 35 U.S.C. 154(b) by 0 days.

(21) Appl. No.: 11/948,053

(22) Filed: Nov. 30, 2007

(65) Prior Publication Data

US 2008/0089826 A1    Apr. 17, 2008

Related U.S. Application Data

(63) Continuation of application No. PCT/JP2006/310807, filed on May 30, 2006.

(30) Foreign Application Priority Data

May 30, 2005    (JP)    ............................. 2005-157882

(51) Int. Cl.
*C01F 7/16*    (2006.01)
(52) U.S. Cl. .................... 423/263; 423/277; 423/327.1; 423/594.2; 423/594.4; 423/594.6; 423/596; 423/598; 423/599; 423/600
(58) Field of Classification Search ............ 423/594.16, 423/600, 594.9, 604, 618, 263, 277, 327.1, 423/332, 594.2, 594.3, 594.6, 594.8, 596, 423/598, 599, 594.15
See application file for complete search history.

(56) References Cited

U.S. PATENT DOCUMENTS

2002/0172726 A1*    11/2002    Hosono et al. .............. 424/688
2006/0276326 A1    12/2006    Hosono et al.

FOREIGN PATENT DOCUMENTS

JP    2002-316867    10/2002
JP    2003226571    * 12/2003
JP    2004-26608    1/2004
WO    WO 03/033406 A1    4/2003
WO    WO 2005/000741 A1    1/2005

OTHER PUBLICATIONS

Ingram et al, Point defects and transport mechanism in transparent conducting oxides of intermediate conductivity, Feb. 2005, Thin Solid Films, 486, 86-93.*
U.S. Appl. No. 11/948,053, filed Nov. 30, 2007, Hosono, et al.
U.S. Appl. No. 11/948,147, filed Nov. 30, 2007, Hosono, et al.
H. Hosono, et al., "Shitsuon • Kukichu de Antei na Electride Kessho C12A7: e-no. Tairyo Goseiho", the Ceramic Society of Japan 2004 Nen Nenkai Koen Yokoshu, Mar. 22, 2004, vol. 2004, pp. 116.
F.M. Lea, et al., "The Chemistry of Cement and Concrete", Edward Arnold & Co., London, 1956.
O. Yamaguchi, et al., "New Compound in the System $SrO$-$Al_2O_3$", J. Am. Ceram. Soc., vol. 69, No. 2, 1986, pp. C36-C-37.
M. Imaoka, Glass Handbook (compiled by Sakka, Takahashi, Sakaino), Asakura Publishing, 880 pages (1975).
W. Li, et al., "Nucleation and Crystallization in Calcium Aluminate Glasses", Journal of Non-Crystalline Solids, vol. 225, 1999, pp. 199-207.
S.Kim, et al., "Simple and Efficient Fabrication of Room Temperature Stable Electride: Melt-Solidification and Glass Ceramics", J. Am. Chem. Soc., vol. 127, 2005, pp. 1370-1371.

* cited by examiner

*Primary Examiner*—Wayne Langel
*Assistant Examiner*—James Fiorito
(74) *Attorney, Agent, or Firm*—Oblon, Spivak, McClelland, Maier & Neustadt, L.L.P.

(57) ABSTRACT

Provided is a method for preparing an electroconductive mayenite type compound with good properties readily and stably at low cost.

A production method of an electroconductive mayenite type compound comprising a step of subjecting a precursor to heat treatment, is a method for preparing an electroconductive mayenite type compound, comprising a step of subjecting a precursor to heat treatment; wherein the precursor is a vitreous or crystalline material, which contains Ca and Al, in which a molar ratio of ($CaO$:$Al_2O_3$) is from (12.6:6.4) to (11.7:7.3) as calculated as oxides, and in which a total amount of $CaO$ and $Al_2O_3$ is at least 50 mol %, and wherein the heat treatment is heat treatment comprising holding the precursor at a heat treatment temperature T of from 600 to 1415° C. and in an inert gas or vacuum atmosphere with an oxygen partial pressure $P_{O2}$ in a range of $P_{O2} \leq 10^5 \times \exp[\{-7.9 \times 10^4/(T+273)\}+14.4]$ in the unit of Pa.

10 Claims, 1 Drawing Sheet

METHOD FOR PREPARING ELECTROCONDUCTIVE MAYENITE TYPE COMPOUND

TECHNICAL FIELD

The present invention relates to a method for preparing an electroconductive mayenite type compound.

BACKGROUND ART

A mayenite type compound has a typical composition of $12CaO.7Al_2O_3$ (hereinafter referred to as "C12A7") and a characteristic crystal structure composed of three-dimensionally linked voids or cages with a diameter of about 0.4 nm. The framework of the cages has a positive electric charge and there are 12 cages per unit lattice. One sixth of the cages are occupied by oxygen ions in order to satisfy an electrically neutral condition of the crystal, and these oxygen ions are particularly called "free oxygen ions" because they have properties chemically different from those of the other oxygen ions constituting the framework. For the reason described above, the C12A7 crystal is denoted as $[Ca_{24}Al_{28}O_{64}]^{4+}.2O^{2-}$ (Non-patent Document 1).

Another known mayenite type compound is $12SrO.7Al_2O_3$ (hereinafter referred to as "S12A7"), and there also exists a mixed crystal compound of C12A7 and S12A7 with any optional mixing ratio of Ca and Sr (Non-patent Document 2).

Hosono et al. found that a powder of the C12A7 crystal or its sintered product was heat-treated in an $H_2$ atmosphere to make clathrate $H^-$ ions in the cages, and then irradiated with ultraviolet light to make clathrate electrons in the cages, thereby inducing permanent electroconductivity at room temperature (Patent Document 1). The clathrate electrons are weakly bound to the cages and can freely move in the crystal, whereby electroconductivity is imparted to the C12A7 crystal of the mayenite type compound. However, the electroconductive mayenite type compound obtained by this method cannot include an enough amount of clathrate electrons, so that the electroconductivity cannot be sufficient.

Hosono et al. also found that when a C12A7 single crystal was subjected to a reducing treatment with an alkali metal vapor, the free oxygen ions in the cages were replaced by electrons to obtain a single-crystal electroconductive mayenite type compound (Patent Document 1). However, this method takes a long period of time to prepare the single crystal and to conduct the reducing treatment with calcium, and it is thus difficult to industrially apply the method.

Heretofore, it was known that a glass with the C12A7 composition could be obtained by the melting and rapid quenching method which was a usual production method of glass (cf. Non-patent Document 3), and that the glass was re-heated to crystallize, thereby preparing C12A7 of the mayenite type compound. Li et al. reported that a temperature required for re-crystallization of the C12A7 glass obtained by the melting and rapid quenching method in air was from 940 to 1,040° C.; a main crystal phase produced was the C12A7 crystal of the mayenite type compound; and a $CaAl_2O_4$ crystal was produced as a by-product (Non-patent Document 4). The mayenite type compound thus obtained was, however, an insulator having free oxygens in the cages.

Hosono et al. found that a transparent glass prepared by melting the C12A7 crystal in a carbon crucible was subjected to a re-heating treatment at 1600° C. and in an atmosphere with an oxygen partial pressure as extremely low as $10^{-11}$ Pa for one hour or at 1000° C. in vacuum for 30 minutes to crystallize, thereby producing an electroconductive mayenite type compound (Non-patent Document 5). It was, however, difficult to industrially produce the compound at low cost and on a large scale by this method because the re-heating treatment required the re-heating process at the high temperature to re-melt the glass and, in the atmosphere of extremely low oxygen partial pressure or in vacuum.

Patent Document 1: WO2005-000741
Non-patent Document 1: F. M. Lea and C. H. Desch, The Chemistry of Cement and Concrete, 2nd ed., p. 52, Edward Arnold & Co., London, 1956.
Non-patent Document 2: O. Yamaguchi, A. Narai, K. Shimizu, J. Am. Ceram. Soc. 1986, 69, C36.
Non-patent Document 3: Minoru Imaoka, Glass Handbook (compiled by Sakka, Takahashi, Sakaino), Asakura Publishing, 880 pages (1975)
Non-patent Document 4: W. Li, B. S. Mitchell, J. Non-Cryst. Sol. 1999, 255 (2, 3), 199.
Non-patent Document 5: S. W. Kim, M. Miyakawa, K. Hayashi, T. Sakai, M. Hirano, and H. Hosono, J. Am. Chem. Soc., http://pubs.acs.org/journals/jacsat/, Web Release Date: 15 Jan. 2005).

DISCLOSURE OF THE INVENTION

Object to be Accomplished by the Invention

It is an object of the present invention to overcome the above-mentioned drawbacks in the prior art. Namely, the conventional techniques required expensive facilities, control of complicated reaction conditions, and reaction at the high temperature or for the long period of time in order to prepare the electroconductive mayenite type compound. Therefore, it was difficult to stably produce an electroconductive mayenite type compound with good properties at low cost.

Means to Accomplish the Object

In order to accomplish the object, the present invention provides a method for preparing an electroconductive mayenite type compound, which comprises a step of subjecting a precursor to heat treatment,
wherein the precursor is a vitreous or crystalline material, which contains Ca and Al, in which a molar ratio of (CaO: $Al_2O_3$) is from (12.6:6.4) to (11.7:7.3) as calculated as oxides, and in which a total amount of CaO and $Al_2O_3$ is at least 50 mol %, and wherein the heat treatment is heat treatment comprising holding the precursor at a heat treatment temperature T of from 600 to 1,415° C. and in an inert gas or vacuum atmosphere with an oxygen partial pressure $P_{O2}$ in a range of
$P_{O2} \leq 10^5 \times \exp[\{-7.9 \times 10^4/(T+273)\}+14.4]$ in the unit of Pa.

In this case, the precursor is preferably a mayenite type compound having a typical composition of $12CaO.7Al_2O_3$ and having a crystal structure composed of three-dimensionally linked cages, or an isomorphous compound obtained by replacing part or all of Ca and Al of the mayenite type compound by another element.

Part or all of Ca in the precursor may be replaced by the same number of Sr atoms, or part of Al in the precursor may be replaced by the same number of Si atoms or Ge atoms.

Furthermore, the precursor may contain from 0 to 17 mol % in total of at least one member selected from the group consisting of Si, Ge and B as calculated as oxides; from 0 to 5 mol % in total of at least one member selected from the group consisting of Li, Na and K as calculated as oxides; from 0 to 10 mol % in total of at least one member selected from the group consisting of Mg and Ba as calculated as oxides; from 0 to 8 mol % in total of at least one member selected from the group consisting of (at least one rare earth element selected from the group consisting of Ce, Pr, Nd, Sm, Eu, Gd, Tb, Dy, Ho, Er, Tm and Yb) and (at least one transition metal element or typical metal element selected from the group consisting of Ti, V, Cr, Mn, Fe, Co, Ni and Cu) as calculated as oxides.

In the present invention, the precursor may be a vitreous material and the method may further comprise a step of heating the precursor at 950-1,415° C. prior to the heat treatment step, or may comprise the heat treatment step wherein the heat treatment temperature T is from 950 to 1,415° C. Alternatively, the precursor may be a crystalline material with a crystal structure other than that of the mayenite type compound and the method may further comprise a step of heating the precursor at 1,000-1,415° C. prior to the heat treatment step, or may comprise the heat treatment step wherein the heat treatment temperature T is from 1,000 to 1,415° C.

In the present invention, the precursor may be a powder, a press-molded product obtained by press-molding a powder, or a sintered product obtained by sintering a press-molded product resulting from molding of a powder, or may be in the form of a plate.

Furthermore, in the present invention, the heat treatment is preferably carried out in such an atmosphere that the precursor is sealed with a reducing agent selected from carbon, Al and Ti, in a container.

The present invention further provides an electroconductive mayenite type compound prepared by the method as defined above, which has an electrical conductivity of more than 100 S/cm.

Effects of the Invention

The preparation method of the present invention permits us to synthesize the electroconductive mayenite type compound with good electroconductivity in good yield, without need for expensive facilities or complicated control, and the compound can be produced at low cost and on a large scale. In addition, the electroconductive mayenite type compound in the form of bulk, powder or film can be obtained at low cost.

BEST MODE FOR CARRYING OUT THE INVENTION

Figure 1:
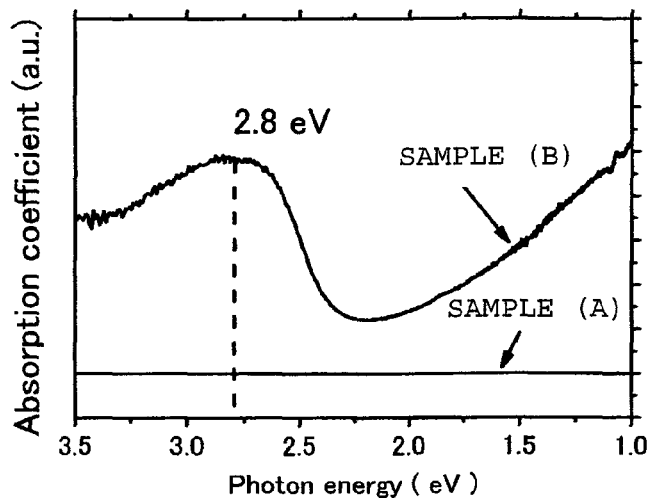
FIG. 1 is a graph showing photoabsorption spectra of a C12A7 crystal powder sample (A) before the heat treatment and an electroconductive C12A7 crystal powder sample (B) after the heat treatment in Example 1.

In the present invention, the following (1) to (4) may, for example, be used as a precursor for preparing an electroconductive mayenite type compound.
(1) An insulating mayenite type compound with a typical composition of $12CaO.7Al_2O_3$,
(2) an isomorphous compound obtained by replacing part or all of cations or anions in the framework or cages within the range where this crystal lattice framework and the cage structure formed by the framework are maintained (the insulating or electroconductive mayenite type compound with the typical composition of $12CaO.7Al_2O_3$ and the isomorphous compound resulting from replacement of cations or anions thereof will be referred to simply as "C12A7 compound"),
(3) a glass with a composition equivalent to that of the above-mentioned C12A7 compound, and
(4) a powder mixture of an oxide mixture with a crystal structure other than that of the mayenite type compound, a single-component oxide, a carbonate, a hydroxide, and so on, mixed in a composition corresponding to the above-mentioned C12A7 compound, (hereinafter referred to simply as "raw material mixture").

When the glass having the composition equivalent to that of the above-mentioned C12A7 compound is used as the precursor, the above-mentioned heat treatment is preferably carried out after a step of heating the precursor at 950-1,415° C. to precipitate the C12A7 compound in the precursor glass. Alternatively, the heat treatment step may be carried out at the heat treatment temperature of from 950 to 1,415° C. to precipitate the C12A7 compound from the glass in the heat treatment step and produce the electroconductive mayenite type compound.

When the above-mentioned raw material mixture is used as the precursor, the above-mentioned heat treatment is preferably carried out after completion of a step of heating the precursor at 1,000-1,415° C., prior to the heat treatment step, to produce the C12A7 compound by a solid phase reaction of the powder mixture. Alternatively, the heat treatment step may be carried out at the heat treatment temperature of from 1,000 to 1,415° C. to produce the C12A7 compound from the raw material mixture by the solid phase reaction and produce the electroconductive mayenite type compound.

The heat treatment at 600-1,415° C. under the forgoing oxygen partial pressure causes a reaction of withdrawing free oxygens from the C12A7 compound used as the precursor or from the C12A7 compound produced from the vitreous material or the raw material mixture, thereby producing the electroconductive mayenite type compound. Then, the free oxygen ions are transported to near the surface, and free oxygens or electrons produced are diffused, whereby the entire precursor is changed to the electroconductive mayenite type compound.

The raw material mixture may be a mixture of compounds of elemental substances constituting the C12A7 compound, for example, a mixture of calcium carbonate and aluminum oxide mixed in a predetermined composition ratio. In addition, the raw material mixture may also be a calcium aluminate compound with a ratio of Ca and Al, for example, 3:1 or 1:1 (hereinafter referred to as a C3A compound or a CA compound, respectively). The raw material mixture may also be a mixture of calcium aluminate compounds having various Ca/Al ratios, or a mixture of glasses having the same compositions as those of the aforementioned compounds.

The precursor to be used in the present invention contains Ca and Al. CaO and $Al_2O_3$ are main components constituting the mayenite type compound. In the precursor, the molar ratio of $CaO:Al_2O_3$ is from 12.6:6.4 to 11.7:7.3, preferably from 12.3:6.7 to 11.9:7.1, as calculated as oxides. The total amount of CaO and $Al_2O_3$ is at least 50 mol %, preferably from 75 to 100 mol %. When the precursor has such a composition, a rate of the electroconductive mayenite type compound produced by the heat treatment, i.e., yield can be increased, which is preferable.

Furthermore, the precursor may contain another element than Ca and Al; for example, part or all of Ca may be replaced by the same number of Sr atoms, as long as the effects of the present invention are not impaired.

Specific examples of the C12A7 compound include mayenite type compounds and isomorphous compounds such as (1) to (4) below. However, the present invention is not limited thereto.

(1) Strontium aluminate $Sr_{12}Al_{14}O_{33}$ in which a part of the framework of the C12A7 compound or all cations are replaced, or calcium strontium aluminate $Ca_{12-x}Sr_xAl_{14}O_{33}$ which is mixed crystals with an arbitrarily-changed mixing ratio of Ca and Sr,
(2) silicon-substituted mayenites $Ca_{12}Al_{10}Si_4O_{35}$,
(3) compounds in which free oxygens in the cages are replaced by anions such as $OH^-$, $F^-$, $S^{2-}$ or $Cl^-$, e.g., $Ca_{12}Al_{14}O_{32}:2OH^-$ or $Ca_{12}Al_{14}O_{32}:2F^-$, and
(4) compounds in which both of cations and anions are replaced, e.g., wadalite $Ca_{12}Al_{10}Si_4O_{32}:6Cl^-$.

If the precursor contains Si, Ge or B, the melting temperature of the precursor is reduced to facilitate the melting, whereby the melt can be vitrified and homogenized, or molded in solidification of the melt. Therefore, the electroconductive mayenite type compound of a bulk form can be obtained in a desired size and shape. Furthermore, preparation of glass powder becomes easier, which is preferable. When at least one member from Si, Ge and B is incorporated in an amount of at least 1.5 mol %, preferably from 3 to 17 mol %, in total as calculated as oxides, the above-mentioned effect can be achieved well, which is preferable.

Furthermore, Si or Ge may be incorporated by replacement of the Al position in the electroconductive mayenite type compound produced and in such a case, the doping effect provides an effect to increase the density of clathrate electrons in the crystal. In order to obtain the doping effect, the content is preferably at least 6 mol %. Furthermore, if the content of Si, Ge or B is excessive, the melting temperature will increase again. If the content of Si or Ge is excessive, the doping effect will not be obtained. Therefore, the content of Si, Ge or B is preferably at most 17 mol %.

Li, Na and K are components to decrease the melting temperature and at least one member out of them is preferably incorporated in an amount of from 0 to 5 mol % in total as calculated as oxides, more preferably from 0 to 3 mol %. If the content exceeds 5 mol %, the electroconductivity will decrease.

Mg and Ba are components to decrease the melting temperature and at least one member out of them is preferably incorporated in an amount of from 0 to 10 mol %, more preferably from 0 to 5 mol %, in total as calculated as oxides. If the content exceeds 5 mol %, the electroconductivity will decrease.

Furthermore, the raw material may contain as an impurity from 0 to 8 mol %, preferably at most 1 mol %, in total as calculated as oxides, of at least one member selected from the group consisting of at least one rare earth element selected from the group consisting of Ce, Pr, Nd, Sm, Eu, Gd, Tb, Dy, Ho, Er, Tm and Yb and at least one transition metal element or typical metal element selected from the group consisting of Ti, V, Cr, Mn, Fe, Co, Ni and Cu. The electroconductive mayenite type compound produced in the present invention may be one in which part or all of the cations or anions are replaced, one in which another compound or the like is added, or one containing an impurity. The precursor can also be a raw material for industrial use such as lime stone, slaked lime, quicklime, alumina, aluminum hydroxide or bauxite, aluminum residual ash, glass, or mayenite type rock as naturally produced ore.

In order to promote the withdrawing reaction of free oxygen ions, the heat treatment according to the present invention is carried out by holding the precursor at a heat treatment temperature T of from 600 to 1,415° C., preferably from 1,200 to 1,415° C., and in an inert gas or vacuum atmosphere with an oxygen partial pressure $P_{O2}$ in the Pa unit in the following range:

$$P_{O2} \leq 10^5 \times \exp[\{-7.9 \times 10^4/(T+273)\}+14.4] \quad (1)$$

Figure 3:
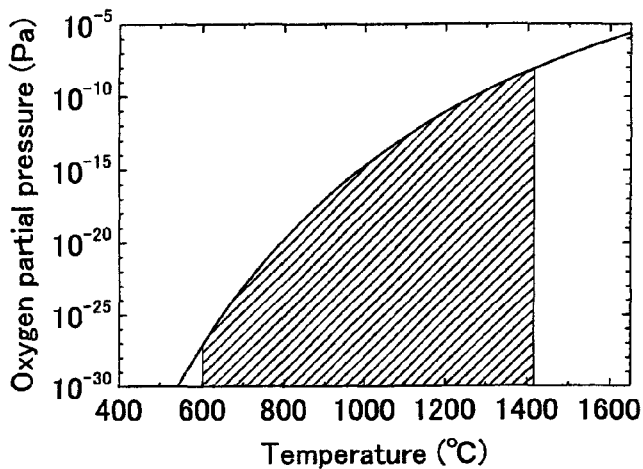
FIG. 3 is a graph in which permissible oxygen partial pressure $P_{O2}$ (vertical axis) in a heat treatment atmosphere is plotted relative to heat treatment temperature (horizontal axis).

Namely, the heat treatment is carried out under the conditions of the heat treatment temperature and oxygen partial pressure $P_{O2}$ in the hatched region in the graph of FIG. 3 which is a plot of Formula (1) with the heat treatment temperature on the horizontal axis and with the oxygen partial pressure $P_{O2}$ in the heat treatment atmosphere on the vertical axis.

By applying the above heat treatment conditions, the withdrawing reaction of free oxygens is promoted on the surface of the precursor, while the self-diffusion coefficient of free oxygens in the precursor becomes so large as to enhance transportation of free oxygen ions, whereby the entire precursor can be changed into the electroconductive mayenite type compound with good electroconductivity.

In the present invention, the electroconductivity is imparted to the mayenite type compound by replacing the free oxygens by electrons, and this replacement reaction goes through movement of free oxygen ions from the bulk to the surface and the withdrawing reaction of free oxygens on the surface. With respect to the C12A7 compound with the typical composition of the mayenite type compound, let us assume the following oxidation reaction: $Ca_{12}Al_{14}O_{32}:2e^- + \frac{1}{2}O_2 = Ca_{12}Al_{14}O_{32}:O^{2-} - \Delta G_{C12A7}$; when the oxygen partial pressure in the atmosphere is approximately at most $PO_2=(1/K)=\exp(\Delta G_O/RT)$, K<1, and the withdrawing reaction proceeds on the surface. If the oxygen partial pressure exceeds the above value, the electroconductive mayenite type compound will take in oxygen in the atmosphere at high temperatures and a reaction of replacing the electrons in the cages by the free oxygen ions will proceed, so as to degrade the electroconductivity of the resultant mayenite type compound.

If the heat treatment temperature exceeds 1,415° C., the precursor will melt, which is undesirable. When the temperature is at most 1,415° C., the reaction does not go through the melt, and it becomes possible to produce the compound with use of inexpensive apparatus. If the temperature is less than 600° C., a rate of progress of the withdrawing reaction of free oxygens tends to slow down, so as to require a long period of time to produce the electroconductive mayenite type compound. When the temperature is at least 1,200° C., the withdrawing reaction of free oxygens is promoted, and the self-diffusion coefficient of the free oxygens in the precursor becomes remarkably large, so as to shorten the period of time for producing the electroconductive mayenite type compound, which is preferred.

Even if the heat treatment temperature is from 600 to 1,415° C., no desired electroconductive mayenite type compound can be obtained if the oxygen partial pressure $P_{O2}$ in the heat treatment atmosphere is larger than the right-hand side of Formula (1). It is preferred to make the oxygen partial pressure in the heat treatment atmosphere as low as possible, but even in the range of less than $10^{-34}$ Pa, the effect of improving the electroconductivity of the resultant electroconductive mayenite type compound will not be so remarkable and it might result in increase of cost.

The precursor may take any form of powder, a bulk, a plate, a flake or a pressed product of powder, and in the case of powder, the electroconductive mayenite type compound with good electroconductivity can be obtained by the heat treatment in a short period of time, which is preferable. Therefore, an average particle size of the powder is preferably from 1 to 100 μm. Furthermore, in order to gain better electroconductivity, the average particle size is more preferably at most 10 μm. If the average particle size is at most 1 μm, the powder might be agglomerated by the heat treatment.

Since transportation of free oxygen ions is enhanced at the heat treatment temperature in the present invention, the precursor to be used may be a glass in the form of a bulk or a plate, or a molded or sintered body of powder, thereby obtaining the electroconductive mayenite type compound in the form of a plate or bulk. A single crystal of the C12A7 compound in the form of a plate may also be used. A glass block with a thickness of about 1 cm may also be used.

This low oxygen partial pressure atmosphere can be readily realized as follows: the above-mentioned raw material is placed with a reducing agent in a closed container, and the container is held in an electric furnace, and subjected to heat treatment under flow of an argon gas, a nitrogen gas or a gas containing no oxygen, such as carbon monoxide gas, or under vacuuming, so that the remaining or contaminating oxygen gas reacts with the reducing agent to reduce its partial pressure. However, the present invention is not limited to this method and can apply another method.

The reducing agent to be used may be a metal, an intermetallic compound, a metallic compound, a nonmetal or a non-metallic compound, and a metal or carbon is preferably used because the low oxygen partial pressure can be readily realized. In particular, carbon is preferred because it does not melt at the heat treatment temperature of the present invention and it is easy to use. It is preferred to prepare a hermetically sealable container such as a covered container of carbon and to subject the precursor to the heat treatment in this container, so that the above-mentioned heat treatment atmosphere can be realized in a simple configuration.

When carbon is used as the reducing agent, the heat treatment temperature is preferably at least 900° C. in order to prepare the electroconductive mayenite type compound with good electroconductivity. Furthermore, aluminum or titanium is preferably used as the reducing agent because the low oxygen partial pressure atmosphere can be readily realized so as to obtain the electroconductive mayenite type compound with excellent electroconductivity.

When Al is used as the reducing agent, it is undesirable to use a nitrogen gas as an atmospheric gas because Al reacts with the nitrogen gas at the heat treatment temperature. Namely, the heat treatment atmosphere is preferably selected in accordance with the reducing agent to be used.

As described above, the electroconductive mayenite type compound with good electroconductivity can be synthesized in good yield by applying the production method of the present invention, without need for expensive facilities, control of complicated reaction conditions, or high-temperature or long-term reaction.

EXAMPLES

Example 1, Example 4, and Examples 5 to 8 are examples of the present invention and Example 2 and Example 3 are comparative examples.

Example 1

Calcium carbonate and aluminum oxide were blended so that a molar ratio of $CaO:Al_2O_3$ became 12:7 as calculated as oxides; the mixture was held at 1,300° C. in atmospheric air for 6 hours, and then cooled to room temperature; the resulting sintered product was pulverized to obtain a powder in a particle size of 50 μm. The resulting powder (hereinafter referred to as "powder A") was a white insulator and found to be a C12A7 compound with the mayenite type structure by X-ray diffraction.

The powder A was placed in a covered carbon container and heat treatment was carried out in such a manner that the container was heated to the temperature of 1,300° C. and held for two hours in a nitrogen flow furnace with a nitrogen gas atmosphere having an oxygen concentration of 10 ppm by volume. The atmosphere in the container during the heat treatment had an oxygen partial pressure $P_{O2}$ of $10^{-12}$ Pa by virtue of absorption of oxygen by carbon of the container, which satisfies the relation of the above-mentioned Formula (1).

The resulting powder (hereinafter referred to as "powder B") showed deep green color, and it was found to have the peak of the mayenite type structure by measurement of X-ray diffraction. Furthermore, optical diffuse reflectance spectra were measured with the insulating C12A7 crystal powder sample (A) before the heat treatment and the crystal powder sample (B) after the heat treatment, and were converted to photoabsorption spectra by the Kubelka-Munk method. The spectra obtained are shown in the graph of FIG. 1. It was confirmed from FIG. 1 that the powder B had a strong photoabsorption band induced with a center at 2.8 eV inherent to the electroconductive mayenite type compound, and from the intensity of the photoabsorption, the electron density was found to be $1.6 \times 10^{20}/cm^3$ and the electrical conductivity was found to be more than 1 S/cm by the van der Pauw method. The above verified that the powder of the electroconductive mayenite type compound was obtained.

Examples 2 to 4

The crystal powder sample (A) was subjected to heat treatment in an atmosphere maintained at a low oxygen partial pressure by absorption of oxygen by carbon, in the same manner as in Example 1 except that the heat treatment temperature was changed to 1,000° C., 1,100° C. or 1,200° C., thereby obtaining each of heat-treated products of Examples 2 to 4. The oxygen partial pressures $P_{O2}$ during the heat treatment in Example 2 and in Example 3 were $10^{-14}$ Pa and $10^{-13.5}$ Pa, respectively, which did not satisfy the relation of Formula (1). In Example 4, it was $10^{-13}$ Pa, which satisfied the relation of Formula (1).

It was confirmed by X-ray diffraction that all the samples thus obtained had the peak of the mayenite type structure. The samples subjected to the heat treatment at 1,000° C. and 1,100° C. were white and insulating with their carrier densities of $1.4 \times 10^{17}/cm^3$ and $8.7 \times 10^{17}/cm^3$, respectively. The sample subjected to the heat treatment at 1,200° C. showed light green color due to withdrawal of free oxygens and it was electrically conductive with a carrier density of $7.3 \times 10^{18}/\text{cm}^3$.

Example 5

The powder A was press-molded to obtain a molded product in depth×width×height of about 2 cm×2 cm×1 cm and the product was placed together with an aluminum metal in a covered alumina container. Heat treatment was carried out in such a manner that the container was heated to the temperature of 1,300° C. and held for 10 hours, in a vacuum furnace vacuumized by a rotary pump. In the container during the heat treatment, the oxygen partial pressure was as low as $10^{-21}$ Pa due to absorption of oxygen by aluminum placed together with the molded product in the container, and was the atmosphere under the condition satisfying Formula (1).

Figure 2:
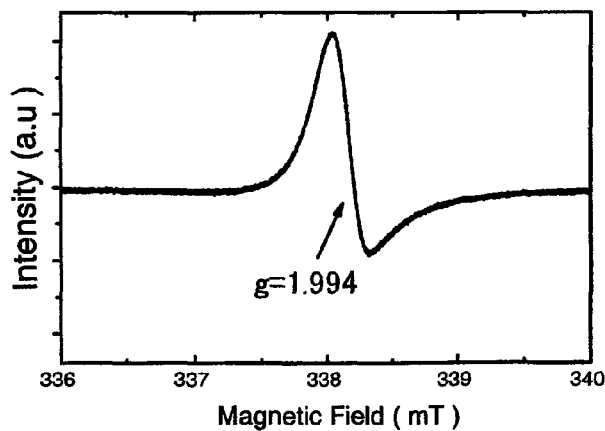
FIG. 2 is a graph showing an ESR signal of an electroconductive C12A7 crystal powder sample (C) after the heat treatment in Example 5.

The heat-treated product thus obtained (crystal powder sample (C)) showed brownish black color and it was confirmed by X-ray diffraction measurement that it had the peak inherent to the mayenite type structure. Furthermore, it was found from the photoabsorption spectrum that the electron density was $1.4 \times 10^{21}/\text{cm}^3$ and the electrical conductivity was 120 S/cm by the van der Pauw method. As shown in FIG. 2, the ESR signal of the heat-treated product thus obtained was found to be asymmetrical with the value g of 1.994, which is inherent to the electroconductive mayenite type compound with the high electron concentration of more than $10^{21}/\text{cm}^3$. The above verified that the electroconductive mayenite type compound was obtained.

Example 6

A bulk glass was prepared in a composition of ($59.69\text{CaO}-32.21\text{Al}_2\text{O}_3-5.01\text{SiO}_2-0.33\text{Fe}_2\text{O}_3-1.79\text{TiO}_2-0.96\text{MgO}$) and in a cubic shape of 1 cm square by the arc discharge melting method. This sample was used as the precursor and subjected to the heat treatment under the condition satisfying the Formula (1), in the same manner as in Example 1. The sample after the heat treatment showed green color and it was confirmed by X-ray diffraction that it had the peak of the mayenite type structure. The carrier density obtained by the photoabsorption spectrum was $2.5 \times 10^{19}/\text{cm}^3$ and it was electrically conductive. The above verified that the electroconductive mayenite type compound was obtained.

Examples 7 and 8

A C12A7 single crystal prepared by the zone melting method was processed to prepare two plate samples in the thickness of 0.5 mm and in the size of 1 cm square. Each of the C12A7 single crystal plates was placed together with Ti metal in a silica glass tube, and the tube was vacuumized by a rotary pump and sealed. Then heat treatment was carried out in an electronic furnace by holding one plate at 700° C. for 12 hours and the other at 1,000° C. for 120 hours. The atmosphere in the container during the heat treatment was a low oxygen partial pressure as low as $10^{-33}$ Pa at 700° C. or $10^{-22}$ Pa at 1,000° C. because of absorption of oxygen by the Ti metal placed together with the plate in the container, which satisfies the relation of the Formula (1).

The heat-treated products thus obtained showed brownish black color and it was confirmed by X-ray diffraction measurement that they had the peak of the mayenite type structure. It was found by the van der Pauw method and optical diffuse scattering spectrum measurement that the sample maintained at 700° C. had the electrical conductivity of 2 S/cm and the electron density of $3.8 \times 10^{19}/\text{cm}^3$ and that the sample maintained at 1,000° C. had the electrical conductivity of 930 S/cm and the electron density of $1.6 \times 10^{21}/\text{cm}^3$. The above verified that the electroconductive mayenite type compounds were obtained.

INDUSTRIAL APPLICABILITY

The present invention allows us to prepare the electroconductive mayenite type compound, without use of expensive facilities and in a short period of time by the low-cost process. Furthermore, when carbon is used as a reducing agent, carbon is hardly mixed into the product, and an electroconductive mayenite type compound with a high purity can be obtained, without need for a purification process.

Furthermore, it is not necessary to synthesize and use a C12A7 or S12A7 crystal compound as the raw material, and the electroconductive mayenite type compound can be prepared in good yield by using inexpensive lime stone, slaked lime, quick lime, alumina, aluminum hydroxide, bauxite, aluminum residual ash, a glass product, or mayenite type ore naturally produced, and the present invention is thus industrially advantageous.

In addition, the electroconductive mayenite type compound can be used as a field-effect type electron emission material, and by applying the electroconductive mayenite type compound prepared according to the production method of the present invention, it is feasible to realize a small-size electron emission device, display device or X-ray source. Furthermore, as an electrode material, it can be utilized as an electric conductor required to have a special joining property, like a charge-injection material in an organic EL device.

The entire disclosure of Japanese Patent Application No. 2005-157882 filed on May 30, 2005 including the specification, claims, drawings and summary is incorporated herein by reference in its entirety.

What is claimed is:

1. A method for preparing an electroconductive mayenite type compound, comprising subjecting a precursor to a heat treatment,
    wherein the precursor is a vitreous or crystalline material, which comprises Ca and Al, in which a molar ratio of $\text{CaO}:7\text{Al}_2\text{O}_3$ is from 12.6:6.4 to 11.7:7.3 calculated as oxides, and in which a total amount of CaO and $\text{Al}_2\text{O}_3$ is at least 50 mol %, and
    wherein the heat treatment is a heat treatment comprising holding the precursor at a heat treatment temperature T of from 600 to 1,415° C. in an inert gas or vacuum atmosphere with an oxygen partial pressure $P_{O2}$ in a range of
    $P_{O2} \leq 10^5 \times \exp[\{-7.9 \times 10^4/(T+273)\}+14.4]$ in the unit of Pa.

2. The method for preparing an electroconductive mayenite type compound according to claim 1, wherein the crystalline precursor is a mayenite type compound having a composition of $12\text{CaO}.7\text{Al}_2\text{O}_3$ and having a crystal structure composed of three-dimensionally linked cages, or an isomorphous compound obtained by replacing at least a part of Ca and Al in the mayenite type compound by another element.

3. The method for preparing an electroconductive mayenite type compound according to claim 1, wherein a part or all of Ca in the precursor is replaced by the same number of Sr atoms.

4. The method for preparing an electroconductive mayenite type compound according to claim 1, wherein at least a part of Al in the precursor is replaced by the same number of Si atoms or Ge atoms.

5. The method for preparing an electroconductive mayenite type compound according to claim 1, wherein the precursor comprises at least one component selected from the group consisting of (a), (b) and (c), wherein (a) is at least one member selected from the group consisting of Si, Ge and B, and an amount of the component (a) is from 0 to 17 mol % calculated as oxides; (b) is at least one member selected from the group consisting of Li, Na and K, and an amount of the compound (b) is from 0 to 5 mol % calculated as oxides; and (c) is at least one member selected from the group consisting of Mg and Ba, and an amount of the compound (c) is from 0 to 10 mol % calculated as oxides; and wherein the precursor further comprises from 0 to 8 mol % in total of (i) at least one rare earth element selected from the group consisting of Ce, Pr, Nd, Sm, Eu, Gd, Th, Dy, Ho, Er, Tm and Yb, (ii) at least one transition metal element or typical metal element selected from the group consisting of Ti, V, Cr, Mn, Fe, Co, Ni and Cu, or a combination of (i) and (ii) calculated as oxides.

6. The method for preparing an electroconductive mayenite type compound according to claim 1, the method further comprising (i) heating the precursor at 950-1,415° C. prior to the heat treatment, or (ii) the heat treatment at a temperature T from 950 to 1,415° C., wherein the precursor is a vitreous material.

7. The method for preparing an electroconductive mayenite type compound according to claim 1, the method further comprising (i) heating the precursor at 1,000-1,415° C. prior to the heat treatment, or (ii) the heat treatment at a temperature T from 1,000 to 1,415° C., wherein the precursor is a crystalline material with a crystal structure other than that of the mayenite type compound.

8. The method for preparing an electroconductive mayenite type compound according to claim 1, wherein the precursor is a powder, a press-molded product obtained by press-molding the powder, or a sintered product obtained by sintering a press-molded product resulting from molding of the powder.

9. The method for preparing an electroconductive mayenite type compound according to claim 1, wherein the precursor is in a form of a plate.

10. The method for preparing an electroconductive mayenite type compound according to claim 1, wherein the heat treatment is carried out in such an atmosphere that the precursor is sealed in a container with a reducing agent selected from the group consisting of carbon, Al and Ti.

* * * * *